(12) United States Patent
Oh et al.

(10) Patent No.: US 9,484,521 B2
(45) Date of Patent: Nov. 1, 2016

(54) VIBRATION GENERATING APPARATUS

(71) Applicant: SAMSUNG ELECTRO-MECHANICS CO., LTD., Suwon-Si (KR)

(72) Inventors: Hwa Young Oh, Suwon-Si (KR); Jae Kyung Kim, Suwon-Si (KR); Sang Jin Lee, Suwon-Si (KR); Dong Su Moon, Suwon-Si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 386 days.

(21) Appl. No.: 14/249,201

(22) Filed: Apr. 9, 2014

(65) Prior Publication Data
US 2014/0306577 A1    Oct. 16, 2014

(30) Foreign Application Priority Data

Apr. 10, 2013 (KR) .......... 10-2013-0039080
Apr. 4, 2014 (KR) .......... 10-2014-0040454

(51) Int. Cl.
| | | |
|---|---|---|
| *H01L 41/09* | (2006.01) | |
| *B06B 1/06* | (2006.01) | |
| *B06B 1/10* | (2006.01) | |
| *H02N 2/04* | (2006.01) | |

(52) U.S. Cl.
CPC .......... *H01L 41/0926* (2013.01); *B06B 1/0648* (2013.01); *B06B 1/10* (2013.01); *H02N 2/043* (2013.01)

(58) Field of Classification Search
CPC ............ H01L 41/0926; H01L 41/083; H01L 41/092; H04R 17/00; B06B 1/0651; H02N 2/043

USPC .......... 310/323.01, 324, 329, 339, 368, 369
See application file for complete search history.

(56) References Cited

U.S. PATENT DOCUMENTS

| | | | | |
|---|---|---|---|---|
| 7,373,260 B2* | 5/2008 | Kessler | ............ | G01B 5/30 702/35 |
| 8,319,396 B2* | 11/2012 | Onishi | ............ | B06B 1/0651 310/324 |
| 2006/0119218 A1* | 6/2006 | Doshida | ............ | G02B 3/12 310/323.01 |

(Continued)

FOREIGN PATENT DOCUMENTS

| | | |
|---|---|---|
| CN | 201654740 U | 11/2010 |
| CN | 102570898 A | 7/2012 |

(Continued)

OTHER PUBLICATIONS

SIPO Office Action for Chinese Application No. 201410142797.9 which corresponds to the above-referenced U.S. application.

(Continued)

*Primary Examiner* — Shawki S Ismail
*Assistant Examiner* — Bryan Gordon
(74) *Attorney, Agent, or Firm* — LRK Patent Law Firm

(57) ABSTRACT

There is provided a vibration generating apparatus including: a bracket having a circular plate shape; a vibration member having a lower edge portion of a central portion fixed to the bracket and having a closed curved line shape; a piezoelectric element fixed to a lower surface of the vibration member among inner surfaces of the vibration member and deformed when power is applied thereto; and a mass body fixed to the inner surfaces of the vibration member and disposed to face the piezoelectric element.

9 Claims, 5 Drawing Sheets

(56) References Cited

U.S. PATENT DOCUMENTS

| | | | |
|---|---|---|---|
| 2010/0038998 A1* | 2/2010 | Onishi | H04R 17/00 |
| | | | 310/334 |
| 2012/0038471 A1 | 2/2012 | Kim et al. | |
| 2012/0119595 A1* | 5/2012 | Choi | B06B 1/045 |
| | | | 310/25 |
| 2012/0153775 A1 | 6/2012 | Park et al. | |
| 2012/0212100 A1* | 8/2012 | Lee | H01L 41/053 |
| | | | 310/317 |

FOREIGN PATENT DOCUMENTS

| | | |
|---|---|---|
| JP | 08-024788 A | 1/1996 |
| JP | 09-327655 A | 12/1997 |
| JP | 10-285253 A | 10/1998 |
| JP | 11-313395 A | 11/1999 |
| JP | 2001-17917 A | 1/2001 |
| KR | 10-2011-0045486 A | 5/2011 |
| KR | 10-2011-0113511 A | 10/2011 |
| KR | 10-1241030 B1 | 3/2013 |

OTHER PUBLICATIONS

KIPO Notice of Allowance for Korean Application No. 10-2014-0040454 which corresponds to the above-referenced U. S. application.

* cited by examiner

VIBRATION GENERATING APPARATUS

CROSS-REFERENCE TO RELATED APPLICATIONS

This application claims the benefit of Korean Patent Application Nos. 10-2013-0039080 filed on Apr. 10, 2013 and 10-2014-0040454 filed on Apr. 4, 2014, with the Korean Intellectual Property Office, the disclosures of which are incorporated in their entireties herein by reference.

BACKGROUND

The present disclosure relates to a vibration generating apparatus.

A vibration generating apparatus, converting electrical energy into mechanical vibrations using the principle of the generation of electromagnetic force, has been mounted in mobile phones, or the like, to be used for silently notifying a user of call reception by transferring vibrations thereto.

In addition, in accordance with the rapid growth in the market for mobile devices such as mobile phones, or the like, several different functions have been added to mobile devices. Further, mobile devices have been required to be compact while being high quality.

In accordance with this trend, the necessity of developing vibration generating apparatuses having novel structures capable of overcoming disadvantages of existing vibration generating apparatuses and significantly improving quality has increased.

Further, recently, in many markets, mobile phones have been replaced by smart phones in which a touch screen scheme is adopted. Therefore, the use of vibration generating apparatuses, provided for the purpose of generating vibrations at the time of a user touch, has increased.

In addition, a vibration generating apparatus using a piezo-element has recently been released. Such a vibration generating apparatus, using the principle of an inverse piezoelectric effect to generate displacement, by applying a voltage to the piezo-element, generates vibratory force by moving a mass body of a vibrator by the generated displacement.

In the vibration generating apparatus having such a structure, a frequency bandwidth capable of obtaining a predetermined level of vibratory force is wide, such that stable vibration characteristics may be implemented.

However, since a piezo-element should be relatively long in order to secure displacement and vibrations, a length of the vibration generating apparatus is increased and the vibration generating apparatus is vulnerable to damage in the case of impacts when being dropped.

That is, such a vibration generating apparatus has an approximately rectangular parallelepiped shape and a relatively elongated form, such that it may be difficult to miniaturize such a vibration generating apparatus, and such a piezo-element having an elongated form is easily damaged due to external impacts.

Therefore, the development of a structure allowing for the miniaturization of vibration generating apparatuses and preventing damage to piezo-elements has been demanded.

SUMMARY

An aspect of the present disclosure may provide a vibration generating apparatus capable of being miniaturized and having an increased amount of vibrations.

An aspect of the present disclosure may also provide a vibration generating apparatus allowing for decreased damage to piezo-elements due to external impacts.

According to an aspect of the present disclosure, a vibration generating apparatus may include: a bracket having a circular plate shape; a vibration member having a lower edge portion of a central portion fixed to the bracket and having a closed curved line shape; a piezoelectric element fixed to a lower surface of the vibration member among inner surfaces of the vibration member and deformed when power is applied thereto; and a mass body fixed to the inner surfaces of the vibration member and disposed to face the piezoelectric element.

The vibration member may include: a first fixed portion fixed to an upper surface of the bracket; first and second piezoelectric element installation portions extended from the first fixed portion in an outer diameter direction; first and second displacement direction changing portions extended upwardly from the first and second piezoelectric element installation portions, respectively; first and second deformation amplifying portions extended from the first and second displacement direction changing portions in an inner diameter direction, respectively; and a second fixed portion connected to the first and second deformation amplifying portions and having the mass body mounted thereon.

The piezoelectric element may be seated on upper surfaces of the first and second piezoelectric element installation portions and be installed in the vibration member so that both end surfaces thereof are supported by inner surfaces of the first and second displacement direction changing portions.

The piezoelectric element may have a rectangular parallelepiped shape.

A central portion of the mass body may be fixed to a lower surface of the second fixed portion.

The mass body may include protrusion portions protruding in the outer diameter direction and may be roughly coin shaped.

The mass body may have a piezoelectric element insertion groove formed in a lower surface thereof so as to prevent contact with the piezoelectric element.

The vibration generating apparatus may further include a case attached to the bracket and having an internal space.

The vibration generating apparatus may further include a circuit board having one end exposed to the outside of the case through a groove formed in the case and connected to the piezoelectric element.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
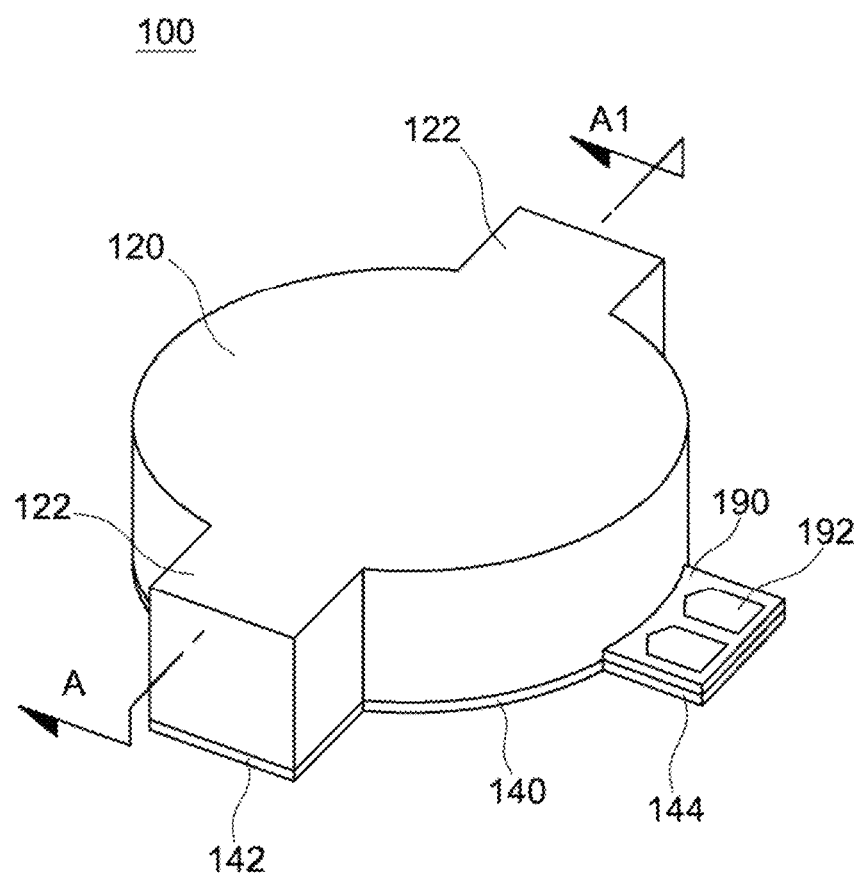
FIG. 1 is a perspective view showing a vibration generating apparatus according to an exemplary embodiment of the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
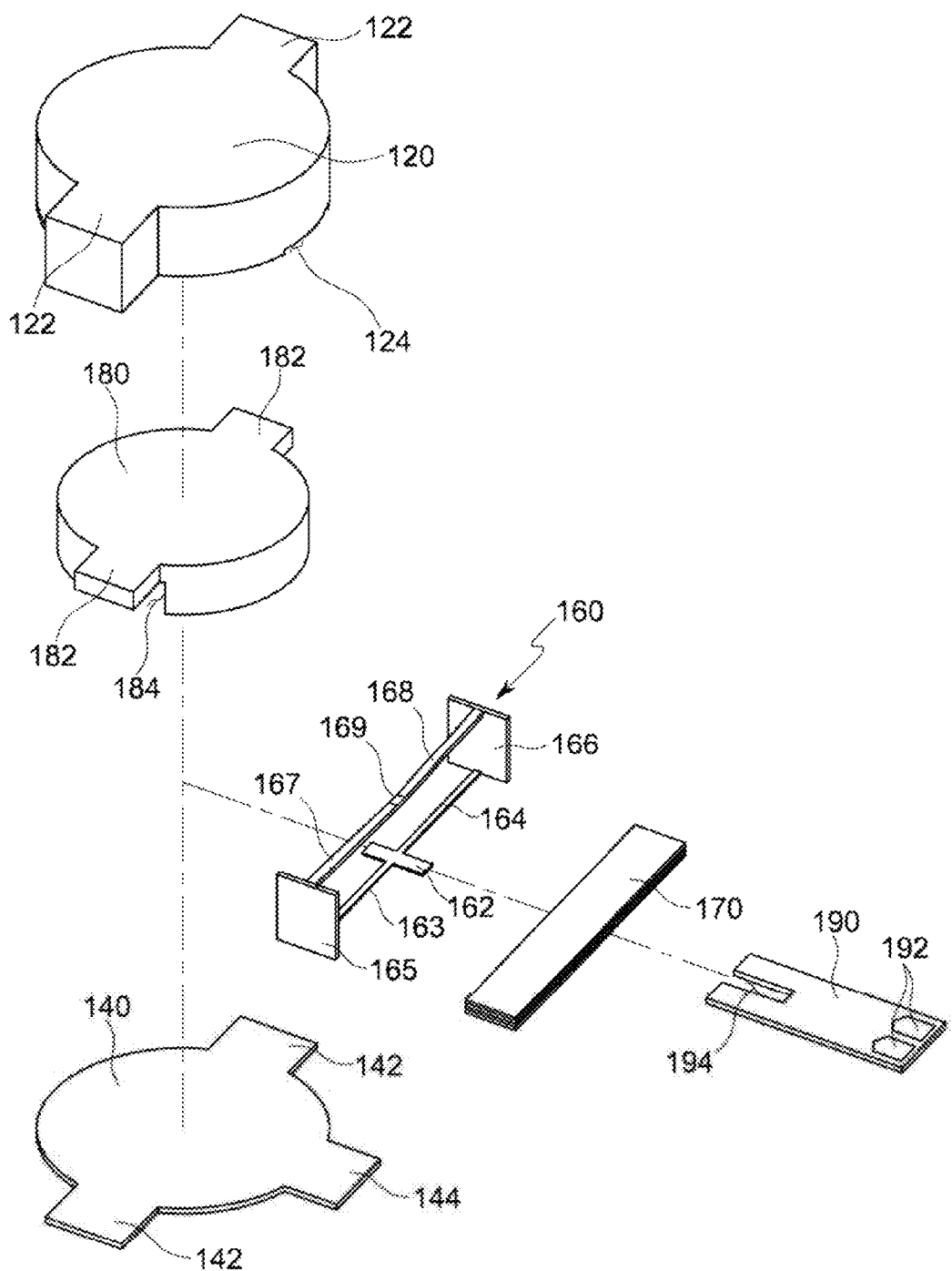
FIG. 2 is an exploded perspective view showing a vibration generating apparatus according to an exemplary embodiment of the present disclosure.

FIG. 1 is a perspective view showing a vibration generating apparatus according to an exemplary embodiment of the present disclosure; FIG. 2 is an exploded perspective view showing a vibration generating apparatus according to an exemplary embodiment of the present disclosure; and FIG. 3 is a cross-sectional view of the vibration generating apparatus according to an exemplary embodiment of the present disclosure taken along line A-A1 of FIG. 1.

Figure 3:
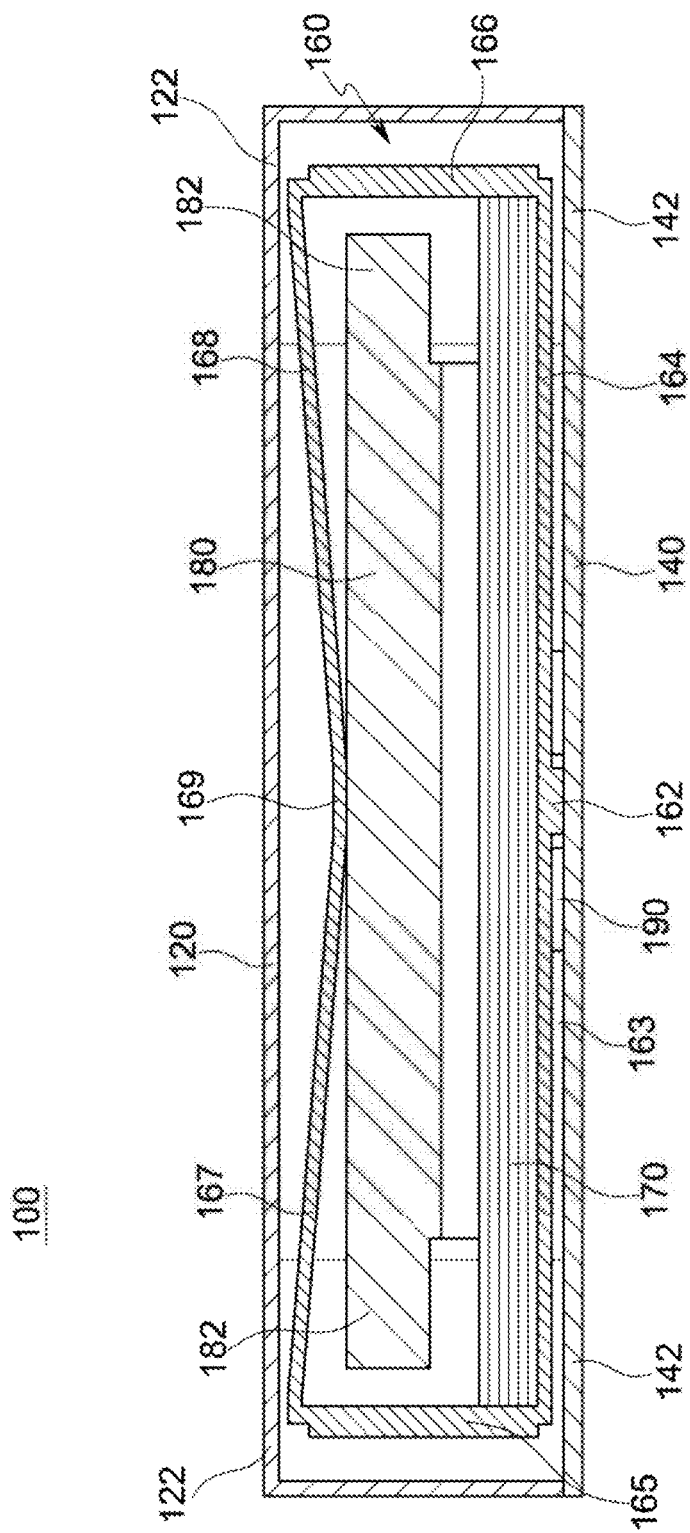
FIG. 3 is a cross-sectional view of the vibration generating apparatus according to an exemplary embodiment of the present disclosure taken along line A-A1 of FIG. 1.

Referring to FIGS. 1 through 3, a vibration generating apparatus 100 according to an exemplary embodiment of the present disclosure may include a case 120, a bracket 140, a vibration member 160, a piezoelectric element 170, a mass body 180, and a circuit board 190 by way of example.

The case 120 may be roughly coin shaped, and may have an internal space formed therein. Meanwhile, the case 120 may be provided with protrusion portions 122 in which both end portions of the vibration member 160 are disposed. The protrusion portions 122 may have a hexahedral shape while protruding from the roughly coin shaped case 120.

In addition, the protrusion portions 122 may be disposed to have an angle of approximately 180 degrees.

That is, the case 120 may be coin shaped while provided with the protrusion portions 122. Meanwhile, the case 120 is not limited to having the above-mentioned shape, but may have a cubic shape in which a size thereof in a length direction and a size thereof in a width direction are substantially the same as each other (for example, cubic shape having the protrusion portions 122), or the like.

Meanwhile, the case 120 may form, together with the bracket 140, an exterior appearance of the vibration generating apparatus 100.

In addition, the case 120 may have a groove 124 formed in a lower edge portion thereof and allowing the circuit board 190 to be led to the outside.

The bracket 140 may be coupled to the case 120 and may have a shape corresponding to that of the case 120. For example, the bracket 140 may have a plate shape and may be provided with protrusion corresponding portions 142 corresponding to the protrusion portions 122 of the case 120.

In addition, the bracket 140 may be provided with an installation portion 144 to which an end of the circuit board 190 is fixed.

In addition, the protrusion corresponding portions 142 and the installation portion 144 may be disposed to have an angle of 90 degrees therebetween.

Meanwhile, the bracket 140 and the case 120 may be coupled to each other by at least one of welding and adhesive bonding.

In addition, the bracket 140 and the case 120 are coupled to each other, such that a closed space may be formed, and the vibration member 160, the piezoelectric element 170, and the mass body 180 may be disposed in the closed space.

The vibration member 160 may form a closed curved line. Meanwhile, the vibration member 160 may include a first fixed portion 162, first and second piezoelectric element installation portions 163 and 164, first and second displacement direction changing portions 165 and 166, first and second deformation amplifying portions 167 and 168, and a second fixed portion 169.

Here, terms with respect to directions will be defined. First, a radial direction refers to a direction from an outer peripheral surface of the case 120 toward the center of the case 120 of FIG. 1 or a direction from the center of the case 120 toward the outer peripheral surface of the case 120.

In addition, a circumferential direction refers to a direction along the outer peripheral surface of the case 120, and a height direction refers to a direction from the bracket 140 toward an upper surface of the case 120.

The first fixed portion 162 may be fixed to a central portion of the bracket 140. Meanwhile, the first fixed portion 162 may have a bar shape so as to support the piezoelectric element 170 in a width direction of the piezoelectric element 170.

The first and second piezoelectric element installation portions 163 and 164 may be extended from central portions of both side surfaces of the first fixed portion 162, respectively. Each of the first and second piezoelectric element installation portions 163 and 164 may have a bar shape so as to support the piezoelectric element 170 in a length direction of the piezoelectric element 170.

Meanwhile, the first and second piezoelectric element installation portions 163 and 164 may be disposed in parallel with the first fixed portion 162 to serve to support the piezoelectric element 170.

The first and second displacement direction changing portions 165 and 166 may be extended from distal ends of the first and second piezoelectric element installation portions 163 and 164, respectively. For example, the first displacement direction changing portion 165 may have the first piezoelectric element installation portion 163 extended from one end thereof, and the second displacement direction changing portion 166 may have the second piezoelectric element installation portion 164 extended from one end thereof.

In addition, the first and second displacement direction changing portions 165 and 166 may contact both end portions of the piezoelectric element 170, respectively, and may be moved by expansion and contraction of the piezoelectric element 170. To this end, the first and second displacement direction changing portions 165 and 166 may have a rectangular plate shape.

Meanwhile, the first and second displacement direction changing portions 165 and 166 may be disposed within the protrusion portions 122 of the case 120, respectively. In addition, the first and second displacement direction changing portions 165 and 166 may be disposed to be spaced apart from end portions of the protrusion portions 122, respectively, by a predetermined interval.

The first and second deformation amplifying portions 167 and 168 may be extended from the other ends of the first and second displacement direction changing portions 165 and 166, respectively, and be inclined by a predetermined angle. That is, since the first and second deformation amplifying portions 167 and 168 are inclined at the predetermined angle, in the case in which the first and second displacement direction changing portions 165 and 166 are deformed by the piezoelectric element 170, the mass body 180 may ascend and descend.

A detailed description thereof will be provided below.

Meanwhile, the second fixed portion 169 may serve to connect the first and second deformation amplifying portions 167 and 168 to each other, and may be bonded to an upper surface of the mass body 180. In other words, a central portion of the upper surface of the mass body 180 may be bonded to the second fixed portion 169.

Meanwhile, a detailed description for an operation of the vibration member 160 will be provided below.

The piezoelectric element 170 may be fixed to the vibration member 160 and be expanded and contracted in the length direction thereof, that is, in the radial direction, when external power is applied thereto. In addition, a lower surface of the piezoelectric element 170 may be supported by the first fixed portion 162 and the first and second piezoelectric element installation portions 163 and 164 and both side surfaces thereof may be supported by the first and second displacement direction changing portions 165 and 166.

Therefore, in the case in which the piezoelectric element 170 is expanded and contracted, the first and second displacement direction changing portions 165 and 166 may be moved.

That is, when the piezoelectric element 170 is not operated, the first and second displacement direction changing portions 165 and 166 may be in a state in which they are elastically deformed by the piezoelectric element 170. Therefore, when the piezoelectric element 170 is contracted, the first and second displacement direction changing portions 165 and 166 may be moved in an inner diameter direction by restoring force, and when the piezoelectric element 170 is expanded, the first and second displacement direction changing portions 165 and 166 may be moved in an outer diameter direction.

Meanwhile, one end of the circuit board 190 may be connected to the piezoelectric element 170, such that external power may be supplied to the piezoelectric element 170.

As an example, the piezoelectric element 170 may have a thickness of 0.3 mm to 1 mm, a width of 1 mm to 4 mm, and a length of 5 mm to 15 mm. Further, the piezoelectric element 170 may be formed by stacking a plurality of piezoelectric layers.

A central portion of an upper surface of the mass body 180 may be fixed to the second fixed portion 169. Meanwhile, mass body 180 may have a shape corresponding to a shape of case 120. That is, the mass body 180 may be roughly coin shaped, and may be provided with protrusion portions 182 corresponding to the protrusion portions 122 of the case 120.

In addition, the mass body 180 may have a piezoelectric element insertion groove 184 formed in a lower surface thereof, wherein the piezoelectric element insertion groove 184 may have the piezoelectric element 170 inserted thereinto at the time of installing the piezoelectric element 170 in the vibration member 160. In addition, the piezoelectric element 170 may be inserted into the piezoelectric element insertion groove 184.

Meanwhile, the piezoelectric element 170 may be disposed to be spaced apart from the mass body 180 by a predetermined interval. In other words, an outer surface of the piezoelectric element 170 may be disposed to be spaced apart from the piezoelectric element insertion groove 184 of the mass body 180 by a predetermined interval.

Further, the piezoelectric element 170 and the piezoelectric element insertion groove 184 may be sufficiently spaced apart from each other so as not to contact each other, even when the mass body 180 descends.

As described above, since the mass body 180 may be roughly coin shaped, the mass body may have a weight increased as compared with a mass body having a bar shape. Therefore, a degree of vibrations may be increased.

The circuit board 190 may have one end bonded to the piezoelectric element 170 and the other end fixed to the installation portion 144 of the bracket 140. That is, one end of the circuit board 190 may be bonded to the lower surface of the piezoelectric element 170, and the other end thereof may be led from the case 120 to be exposed externally.

In addition, the circuit board 190 may have power supply connection terminals 192 formed on the other end thereof.

Further, the circuit board 190 may have a cut groove 194 formed in one end thereof so as to prevent interference with the first fixed portion 162 of the vibration member 160.

Meanwhile, in the vibration generating apparatus 100 according to the exemplary embodiment of the present disclosure, a plurality of damper members may be used in order to suppress occurrence of noise and prevent damage to the piezoelectric element 170 at the time of external impacts. In other words, damper members for preventing contact between the case 120 and the mass body 180 and contact between the bracket 140 and the mass body 180 may be used, and a damper member for preventing contact between the mass body 180 and the piezoelectric element 170 may be used.

In addition, a damper member for preventing contact between the vibration member 160 and the case 120 may be used.

Meanwhile, the damper member may be formed of a material having elasticity and capable of absorbing noise at the time of impacts. For example, the damper member may be formed of poron, rubber, or the like.

As described above, since the weight of the mass body 180 may be increased by the roughly coin shaped mass body 180, the degree of vibrations may be increased.

In addition, the degree of vibrations may be further increased by the vibration member having the closed curved line shape.

Further, the piezoelectric element 170 is inserted into the piezoelectric element insertion groove 184 formed in the mass body 180, such that the mass body 180 may first contact the case 120 and the bracket 140 at the time of drop impact. Therefore, damage to the piezoelectric element 170 may be prevented.

In other words, the piezoelectric element 170 is inserted into the piezoelectric element insertion groove 184 formed in the mass body 180, that is, a structure in which the mass body 180 encloses the piezoelectric element 170 is used, such that the piezoelectric element 170 may not contact the case 120 and the bracket 140. Therefore, direct impacts may not be transferred to the piezoelectric element 170, and only secondary impacts may be transferred to the piezoelectric element 170, such that damage to the piezoelectric element 170 due to external impacts may be decreased.

Next, an operation of the vibration generating apparatus according to an exemplary embodiment of the present disclosure will be described with reference to the accompanying drawings.

Figure 4:
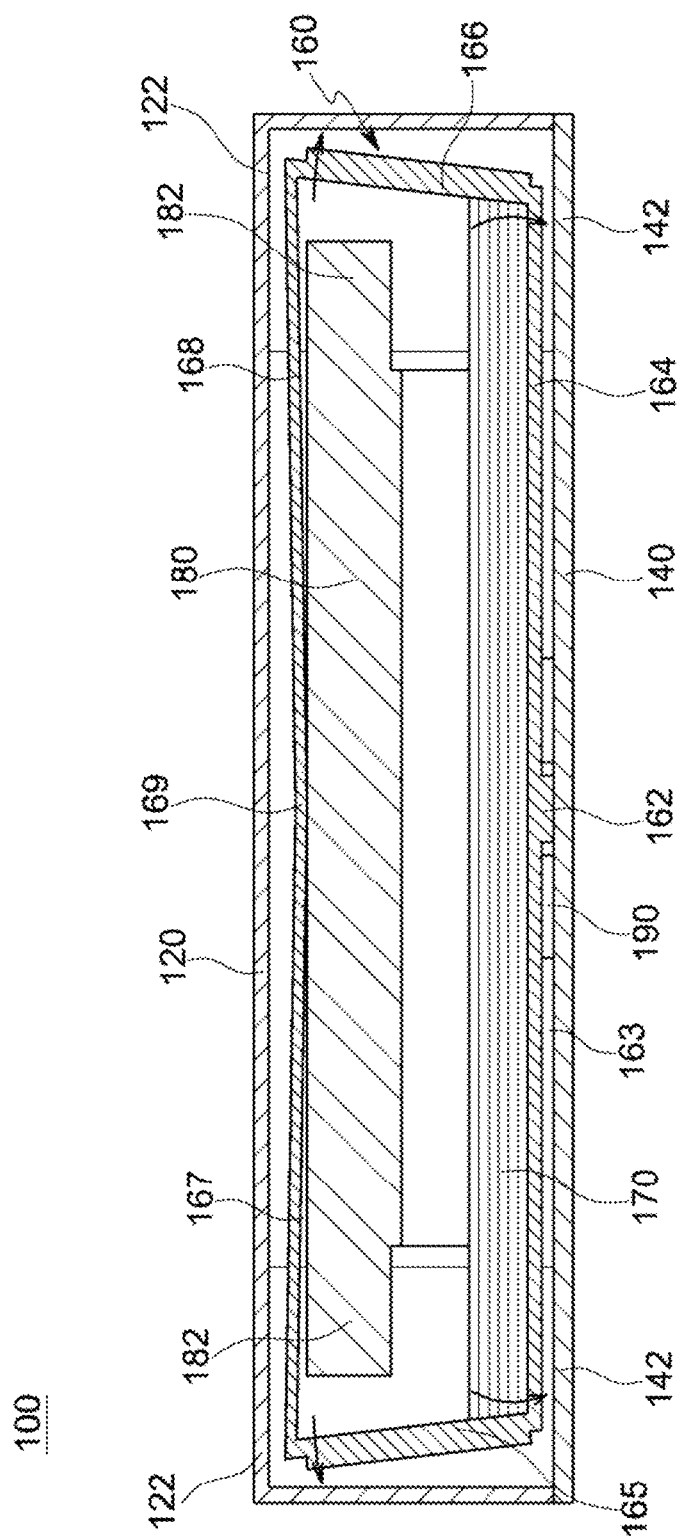
FIGS. 4 and 5 are views illustrating an operation of a vibration generating apparatus according to an exemplary embodiment of the present disclosure.
Figure 5:
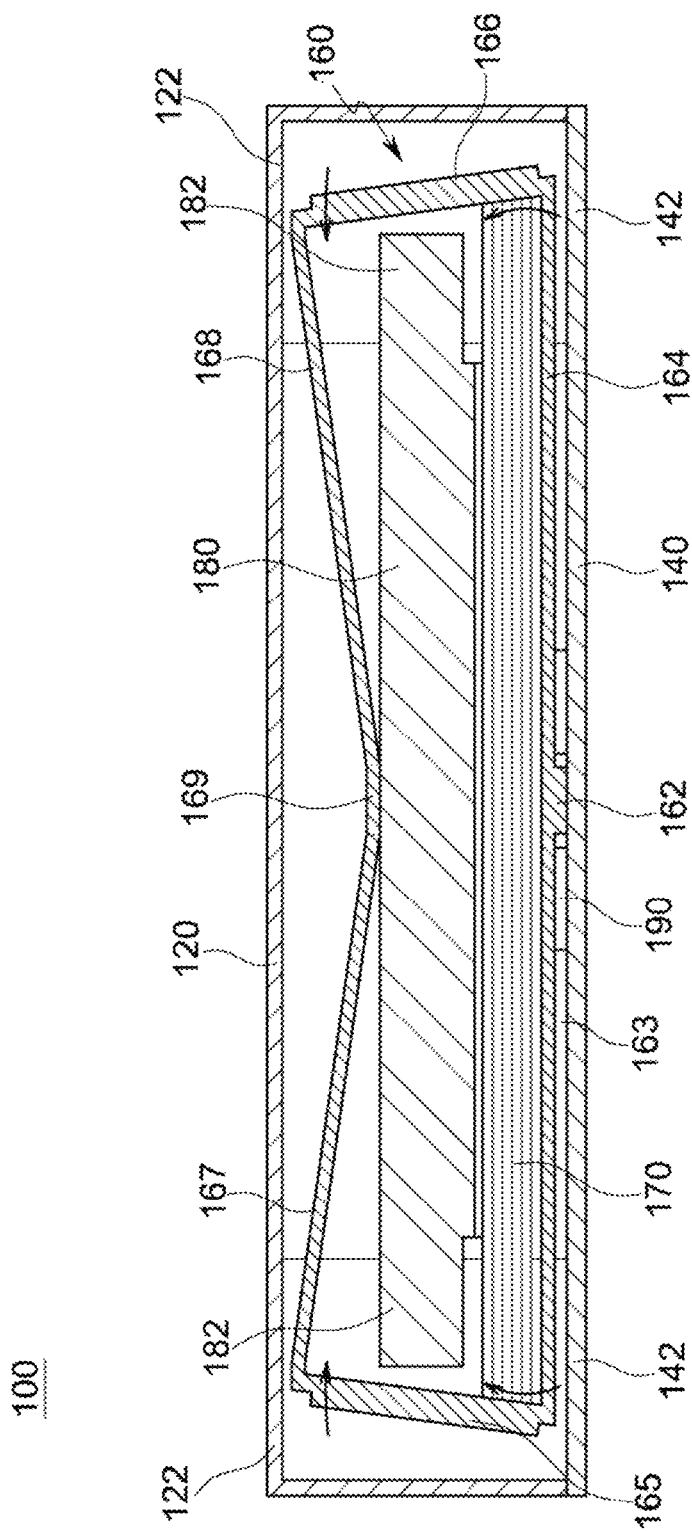

FIGS. 4 and 5 are views illustrating an operation of a vibration generating apparatus according to an exemplary embodiment of the present disclosure. That is, FIG. 4 is a view illustrating a state in which a mass body ascends, and FIG. 5 is a view illustrating a state in which the mass body descends.

First, when a voltage is applied to the piezoelectric element 170 through the circuit board 190, the piezoelectric element 170 may be expanded in the outer diameter direction.

Therefore, the first and second piezoelectric element installation portions 163 and 164 may be bent so that distal ends thereof are directed downwardly, such that lower end portions of the first and second displacement direction changing portions 165 and 166 may be moved downwardly.

When the lower end portions of the first and second displacement direction changing portions 165 and 166 are moved downwardly, upper end portion of the first and second displacement direction changing portions 165 and 166 may be rotated in the outer diameter direction, as shown in FIG. 4.

Therefore, the first and second displacement amplifying portions 167 and 168 that are inclined is deformed to be approximately horizontal, such that the mass body 180 may be moved upwardly.

In addition, when the piezoelectric element 170 is contracted in the inner diameter direction, the first and second piezoelectric element installation portions 163 and 164 may be bent so that the distal ends thereof are directed upwardly. Therefore, the lower end portions of the first and second displacement direction changing portions 165 and 166 may be moved upwardly.

Therefore, the upper end portions of the first and second displacement direction changing portions 165 and 166 may be rotated in the inner diameter direction, as shown in FIG. 5.

In addition, the first and second displacement amplifying portions 167 and 168 may be inclined at an angle larger than an angle in a stop state, by the rotation of the first and second displacement direction changing portions 165 and 166.

Therefore, the mass body 180 may be moved downwardly.

As described above, the mass body 180 is moved upwardly and downwardly by the expansion and the contraction of the piezoelectric element 170, such that vibrations may be generated.

As described above, since the degree of movement of the mass body 180 by the expansion and the contraction of the piezoelectric element 170 may be increased by the vibration member 160 having the closed curved line shape, the degree of vibrations may be further increased.

In addition, since the weight of the mass body 180 may be increased by the roughly coin shaped mass body 180, the degree of vibrations may be increased.

Further, since the piezoelectric element 170 is inserted into the piezoelectric element insertion groove 184 of the mass body 180, the piezoelectric element 170 may be prevented by the mass body 180 at the time of the external impact, such that the damage to the piezoelectric element 170 may be prevented.

As set forth above, according to exemplary embodiments of the present invention, the weight of the mass body may be increased by the roughly coin shaped mass body, such that the degree of vibrations is increased.

In addition, the degree of vibrations may be further increased by the vibration member having the approximately closed curved line shape.

Further, the piezoelectric element may be inserted into the mass body insertion groove formed in the mass body, such that mass body may first contact the case and the bracket at the time of drop impact. Therefore, damage to the piezoelectric element may be prevented.

While exemplary embodiments have been shown and described above, it will be apparent to those skilled in the art that modifications and variations could be made without departing from the spirit and scope of the present disclosure as defined by the appended claims.

What is claimed is:

1. A vibration generating apparatus comprising:
   a bracket having a circular plate shape;
   a vibration member having a lower edge portion of a central portion fixed to the bracket and having a closed curved line shape;
   a piezoelectric element fixed to a lower surface of the vibration member among inner surfaces of the vibration member and deformed when power is applied thereto; and
   a mass body fixed to the inner surfaces of the vibration member and disposed to face the piezoelectric element,
   wherein the vibration member includes:
   a first fixed portion fixed to an upper surface of the bracket;
   first and second piezoelectric element installation portions extended from the first fixed portion in an outer diameter direction;
   first and second displacement direction changing portions extended upwardly from the first and second piezoelectric element installation portions, respectively;
   first and second deformation amplifying portions extended from the first and second displacement direction changing portions in an inner diameter direction, respectively; and
   a second fixed portion connected to the first and second deformation amplifying portions and having the mass body mounted thereon.

2. The vibration generating apparatus of claim 1, wherein the piezoelectric element is seated on upper surfaces of the first and second piezoelectric element installation portions and is installed in the vibration member so that both end surfaces thereof are supported by inner surfaces of the first and second displacement direction changing portions.

3. The vibration generating apparatus of claim 2, wherein the piezoelectric element has a rectangular parallelepiped shape.

4. The vibration generating apparatus of claim 1, wherein a central portion of the mass body is fixed to a lower surface of the second fixed portion.

5. The vibration generating apparatus of claim 1, wherein the mass body includes protrusion portions protruding in the outer diameter direction and is roughly coin shaped.

6. The vibration generating apparatus of claim 5, wherein the mass body has a piezoelectric element insertion groove formed in a lower surface thereof so as to prevent contact with the piezoelectric element.

7. The vibration generating apparatus of claim 1, further comprising a case attached to the bracket and having an internal space.

8. The vibration generating apparatus of claim 7, further comprising a circuit board having one end exposed to the outside of the case through a groove formed in the case and connected to the piezoelectric element.

9. A vibration generating apparatus comprising:
   a case having an internal space;
   a bracket attached to a lower edge portion of the case;
   a vibration member having a lower edge portion of a central portion fixed to the bracket and having a closed curved line shape;

a piezoelectric element fixed to a lower surface of the vibration member among inner surfaces of the vibration member and deformed when power is applied thereto;

a mass body fixed to the inner surfaces of the vibration member to be disposed to face the piezoelectric element and having a shape corresponding to that of the case; and a circuit board having one end exposed to the outside of the case through a groove formed in the case and connected to the piezoelectric element, wherein the vibration member includes:

a first fixed portion fixed to an upper surface of the bracket;

first and second piezoelectric element installation portions extended from the first fixed portion in an outer diameter direction;

first and second displacement direction changing portions extended upwardly from the first and second piezoelectric element installation portions, respectively;

first and second deformation amplifying portions extended from the first and second displacement direction changing portions in an inner diameter direction, respectively; and a second fixed portion connected to the first and second deformation amplifying portions and having the mass body mounted thereon.

* * * * *